United States Patent [19]

Thomas

[11] Patent Number: 5,229,768

[45] Date of Patent: Jul. 20, 1993

[54] ADAPTIVE DATA COMPRESSION SYSTEM

[75] Inventor: Kasman E. Thomas, Stamford, Conn.

[73] Assignee: Traveling Software, Inc., Bothell, Wash.

[21] Appl. No.: 827,737

[22] Filed: Jan. 29, 1992

[51] Int. Cl.[5] ............................................. H03M 7/30
[52] U.S. Cl. ...................................... 341/51; 341/95; 341/55
[58] Field of Search ....................... 341/51, 50, 95, 55, 341/60, 79, 81, 87, 65, 67, 107; 383/56; 358/261.2

[56] References Cited

U.S. PATENT DOCUMENTS

| | | | |
|---|---|---|---|
| 3,914,586 | 10/1975 | McIntosh | 341/51 X |
| 4,464,650 | 8/1984 | Eastman et al. | 340/347 |
| 4,491,934 | 1/1985 | Heinz | 364/900 |
| 4,558,302 | 12/1985 | Welch | 340/347 |
| 4,612,532 | 9/1986 | Bacon et al. | 340/347 |
| 4,814,746 | 3/1989 | Miller et al. | 341/95 |
| 4,847,619 | 7/1989 | Kato et al. | 341/106 |
| 4,870,415 | 9/1989 | Van Maren et al. | 341/94 |
| 4,872,009 | 10/1989 | Tsukiyama et al. | 341/51 X |
| 4,876,541 | 10/1989 | Storer | 341/51 |
| 4,881,075 | 11/1989 | Weng | 341/87 |
| 4,899,148 | 2/1990 | Sato et al. | 341/65 |
| 5,049,881 | 9/1991 | Gibson et al. | 341/95 |

OTHER PUBLICATIONS

Welch, "A Technique for High-Performance Data Compression," Jun. 1984.

*Primary Examiner*—Sharon D. Logan
*Attorney, Agent, or Firm*—Christensen, O'Connor, Johnson & Kindness

[57] ABSTRACT

A system for data compression and decompression is disclosed. A series of fixed length overlapping segments, called hash strings, are formed from an input data sequence. A retrieved character is the next character in the input data sequence after a particular hash string. A hash function relates a particular hash string to a unique address in a look-up table (LUT). An associated character for the particular hash string is stored in the LUT at the address. When a particular hash string is considered, the content of the LUT address associated with the hash string is checked to determine whether the associated character matches the retrieved character following the hash string. If there is a match, a Boolean TRUE is output; if there is no match, a Boolean FALSE along with the retrieved character is output. Furthermore, if there is no match, then the LUT is updated by replacing the associated character in the LUT with the retrieved character. The process continues for each hash string until the entire input data sequence is processed. The method of decompression includes the steps of initializing a decompression LUT to mirror the initial compression LUT and receiving a representational form output from the compressor. The representational form is generally analyzed one character at a time. If the character is a Boolean TRUE, then the content of the LUT addressed by the most recently decoded hash string is output. Otherwise, if the character is a Boolean FALSE, the next character (exception character) in the representational form is output and the content of the LUT addressed by the most recently decoded hash string is output.

20 Claims, 6 Drawing Sheets

| HASH STRING | ASSOCIATED CHARACTER |
|---|---|
| AA | — |
| AB | — |
| AC | — |
| ⋮ | |
| HI | — |
| ⋮ | |
| IS | — |
| ⋮ | |
| S_ | — |
| ⋮ | |
| TH | — |
| ⋮ | |
| _I | — |

*FIG.3A.*

| HASH STRING | CHARACTER |
|---|---|
| HI | — |
| IS | — |
| S_ | — |
| TH | I |
| _I | — |

*FIG.3B.*

| HASH STRING | CHARACTER |
|---|---|
| HI | S |
| IS | — |
| S_ | — |
| TH | I |
| _I | — |

*FIG.3C.*

| HASH STRING | CHARACTER |
|---|---|
| HI | S |
| IS | — |
| _S | — |
| TH | I |
| _I | — |

*FIG.3D.*

| HASH STRING | CHARACTER |
|---|---|
| HI | S |
| IS | — |
| S_ | I |
| TH | I |
| _I | — |

*FIG.3E.*

| HASH STRING | CHARACTER |
|---|---|
| HI | S |
| IS | — |
| S_ | I |
| TH | I |
| _I | S |

ADAPTIVE DATA COMPRESSION SYSTEM

TECHNICAL AREA OF THE INVENTION

The invention relates to a data compression system and, more particularly, to an adaptive data compression system that used fixed length input strings parsed from an input data sequence to produce an encoded output string.

BACKGROUND OF THE INVENTION

The term "data compression" refers generally to the process of transforming a set of data into a smaller compressed representational form. A data decompression process complements a data compression process and is the process of decoding the representational form back into the original set of data or an approximation thereof. Typically, effective data decompression requires a prior knowledge of the encoding method used in the data compression process.

A "data compression system" is a general term applied to an apparatus that implements a data compression and/or data decompression process. Data compression systems are extremely useful in many applications. One application for data compression is for processing textual data such as information in books, programming language source or object code, database information, numerical representations, etc. For example, a data compression system could take the full text of a literary work and compress the work for computer storage in which memory is limited. Another application for a data compression system is in data transmission applications. For example, if a large set of data is required to be transmitted over communications lines, a data compression system can compress the set of data into a smaller representational form. This representational form is then transmitted over the communications lines and recreated by the receiver, using a complementary data decompression method. Clearly, transmittal of a smaller representational form of a set of data will be faster than direct transfer of the original set of data.

FIG. 1 illustrates the basic application of a data compression system. An input data file 11 containing an original set of data is input into a data compressor 13. Data compressor 13 is comprised generally of a CPU, memory and input/output devices, and implements a data compression method. Data compressor 13 compresses input data file 11 and outputs a compressed data file 14 containing the representational form of the original set of data. Compressed data file 14 can then be sent, for example, to a memory storage device 15 or, alternatively, to a transmission station 17 for transmittal to a receiving station 19.

Complementing data compressor 13 is a data decompressor 21, which implements a data decompression method. Like the data compressor 13, the data decompressor 21 is comprised generally of a CPU, a memory, and input/output devices. Data decompressor 21 reconstructs input data file 11 by first retrieving compressed data file 14 from memory storage device 15 or, alternatively, from receiving station 19. Data decompressor 21 then decompresses the representational form and produces an output data file 23 that is identical to or a close approximation of input data file 11. One major goal of data compression systems is to generate an output data file that approximates the content of the input file in an acceptable manner.

One widely used data compressor is based on the Lempel and Ziv method. This method is described in detail in J. Ziv and A. Lempel, "Compression of Individual Sequences Via Variable Rate Coding," *IEEE Transactions on Information Theory*, IT-24(5):530-536, September 1978. A practical reduction of the Lempel and Ziv method was developed by Welch. This method, referred to as the Lempel-Ziv-Welch (LZW) method, is described in T. A. Welch, "A Technique for High-Performance Data Compression," *Computer*, 8-19, June 1984, and is the subject of U.S. Pat. No. 4,558,302.

The LZW method uses a string table implemented in memory that associates input strings with output codes. The string table has the property that, for every input string in the table, the prefix input strings of an input string are also stored in the table. For example, if the input string *rare* appears in the string table, the prefix input strings {r, ra, rar, rare} will also appear in the string table.

In the LZW method, the string table is initialized to the one-letter strings over an alphabet and each of these strings is associated with an output code. The input data sequence is analyzed character serially and the longest input string from the input data sequence that matches an input string currently in the string table is parsed off from the input data sequence. The output code associated to the matched input string in the string table is output. A new input string, comprised of the parsed input string from the input sequence concatenated with the next character in the input data sequence, is added to the string table. The new input string is also assigned an unique output code. The method repeats with the remaining portion of the input data sequence until the entire input sequence is compressed. The output codes generated by the compressor represents the compressed data.

One clear difficulty is that the number of input strings stored in the string table is finite. In one example of the LZW method, the output codes are a fixed length. A common length is 12 bits. Thus, 4096 (two to the twelfth power) different input strings can be assigned an unique output code. The length of the output code constrains the size of the string table, and therefore, the number of different input strings that may be stored in the table. Moreover, the input strings that occupy the string table are representative of the early portion of the input sequence. If the characteristics of the input data sequence change, the early input strings will remain in the string table, thereby not providing maximum compression. Thus, the LZW method does not adapt to changing characteristics in the input data sequence.

It is desirable to design a method of data compression that utilizes a string table that adapts with the input data sequence. An adaptable string table provides better compression as opposed to a string table that reflects only an initial portion of the input sequence. As noted above, another important aspect of data compression systems is the accuracy of the compression/decompression process. Generally, systems exhibit varying ranges of accuracy. The accuracy that is acceptable for a particular application dictates the compression system that may be used. The accuracy of a particular process may be checked each time the process is implemented by incorporating additional hardware or software to perform error checking. A widely used error detection system is a form of a Cyclic Redundancy Check (CRC). See J. E. McNamara, *Technical Aspects of Data Commu-* nication, at 148-158 (1977). Such a system requires additional components to be included in the communications system. Some systems operate without error checking capabilities. Therefore, it is difficult to determine whether the decompressed data is accurate.

The present invention discloses a method of data compression and data decompression that constructs a look-up table (LUT) that continuously adapts to the input data sequence, thus enhancing compression performance. Moreover, the present invention utilizes a fixed-length string-parsing method that produces an automatic error checking mechanism.

SUMMARY OF THE INVENTION

In accordance with this invention, a system for data compression and decompression is disclosed. The method forms a series of fixed length overlapping segments, called hash strings, from the input data sequence. A retrieved character is the next character in the input data sequence after a particular hash string. A hash function operates on each particular hash string to generate a unique address for each particular hash string. The address indicates the location in a look-up table (LUT) where an associated character for that particular hash string is stored.

When a particular hash string is considered, the content of the LUT at the address generated by the hash function operating on the hash string is checked to determine whether the associated character at that address matches the retrieved character following the hash string. If there is a match, a Boolean TRUE is output; if there is no match, a Boolean FALSE along with the retrieved character is output. Furthermore, if there is no match, then the LUT is updated by replacing the associated character in the LUT with the retrieved character. The process continues for each hash string until the entire input data sequence is processed. The output is referred to as a representational form of the input data sequence. In this manner, the LUT configuration represents the most recently encountered character strings. Thus, if there is relatively high string repetition in the input data sequence, the compression level will also be high.

In accordance with further aspects of the present invention, a method of decompression is also provided. The method includes the steps of initializing a decompression LUT to mirror the initial compression LUT and receiving a representational form. The representational form is generally analyzed one character at a time. If the character is a Boolean TRUE, then the content of the LUT addressed by the most recently decoded hash string is output. Otherwise, if the character is a Boolean FALSE, the next character (exception character) in the representational string is output and the content of the LUT addressed by the most recently decoded hash string is output.

In accordance with additional aspects of the present invention, the hash string is two characters long. Thus, to form a new hash string after a match has been attempted, the first character of the hash string is dropped and the next retrieved character is appended to the second character of the hash string. When the hash string is two characters long, the compression system initially outputs the first two characters of the input string uncoded. Similarly, the decompression system outputs the first two characters from the representational form without analysis.

In accordance with other aspects of the present invention, a middle of square hash function is used to generate LUT addresses from the hash strings.

BRIEF DESCRIPTION OF THE DRAWINGS

The foregoing advantages of this invention will become more readily appreciated as the same becomes better understood by reference to the following detailed description, when taken in conjunction with the accompanying drawings, wherein:

FIGS. 3A-3F are a series of conceptual look-up tables formed by the present invention during compression or decompression;

FIG. 4 is a pictorial representation of the parsing of an input data sequence in accordance with the present invention;

FIG. 5 is a pictorial representation of a representational form produced by the system of the present invention.

DESCRIPTION OF THE PREFERRED EMBODIMENT

Figure 1:
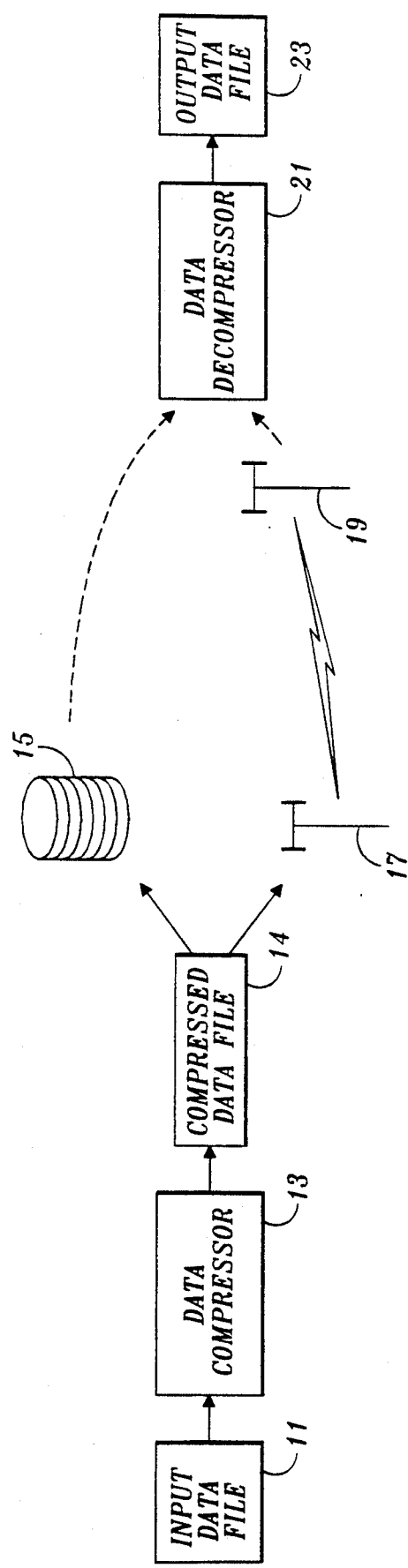
FIG. 1 is a pictorial diagram illustrating two applications of a prior art data compression system.

The data compression system of the present invention implements a single-pass, adaptive compression method that examines an input data file in character-serial fashion, continuously updating a look-up table (LUT) that relates a portion of the input data sequence to a look-ahead character. The complementary data decompression method updates a decompression LUT in an identical fashion to the updating process during compression and generates an output data sequence identical to the input data sequence. The present invention utilizes a look-ahead process that anticipates the repetition of fixed-length strings throughout the input data sequence. The degree of compression obtained by the present invention depends on the amount of string repetitiveness within the input data sequence. Thus, if there is substantial repetition in the input data sequence, there is high potential for data compression. However, if there is absolutely no string repetition, the present invention does not compress the data. The data compression system executes the compression and decompression methods utilizing hardware that includes a CPU, input/output devices, and memory. The CPU controls the process, the input/output devices receive and output data sequences, and the memory provides storage for the LUT. One of ordinary skill in the art of computer programming will understand the necessary programming steps for carrying out the present invention from the following description.

In general, a fixed length sequence of discrete characters is read from an input data file. This sequence of characters stored in the input data file is called the input data sequence. Each character of the sequence in turn is used to build or modify a look-up table (LUT). In one preferred embodiment, the LUT is addressed by hashing the sequences to produce table addresses. An initial hash string is formed from characters at the beginning of the input data sequence. In one preferred embodiment, the hash string length is two characters; however, it can be appreciated that the hash string length is arbitrary, with different lengths resulting in different compression performances. The hash string is used as an operand in a hash function, the hash function outputting a memory address. A single character, referred to as an associated character, is stored at the address provided by the hash function. In order to determine the output, a comparison is made between the associated character with a retrieved character. The retrieved character is the next, or look-ahead, character sequentially following the hash string in the input data sequence. If the retrieved character and the associated character match, a Boolean TRUE (1) is output. Otherwise, a Boolean FALSE (0) is output and the retrieved character replaces the associated character at the memory address. Finally, a new hash string is formed by eliminating the first character in the current hash string and appending the retrieved character to the end of the hash string. The hashing, matching, and outputting steps are repeated until the input data sequence has been completely processed, one character at a time. This compression process is described in greater detail with reference to FIG. 2. At boxes 31-35, the input data file is received, the input data sequence is extracted therefrom, and an initial hash string is formed. At box 36, a loop incorporating boxes 37-47 is initiated. The loop is repeated until the entire input data sequence has been analyzed. At boxes 37-47, the compression is performed. As noted above, the compression method may be implemented on a general purpose computer which includes a central processing unit, memory, and an input/output device. The compression method is controlled by a program executed by the central processing unit and/or dedicated hardware.

Hash functions are well known in the art of memory data management. Such functions are described in E. Horowitz and S. Sahni, *Fundamentals of Data Structures*, at 456 et seq. (1976). A hash function is a function that operates against a hash string, also called an operand, to produce a memory address. For example, the hash function, $f$(HASH STRING), performs the function $f$ against the operand HASH STRING and outputs a memory address. Optimally, in the present invention the hash function is chosen so that each different hash string maps to a different memory address. For example, the hash strings AB, BC, and CD would all map to different memory addresses. The memory addresses that are produced by the function $f$(HASH STRING) are addresses to an LUT in memory. As used in the present invention, the table entries each contain an associated character. Thus, conceptually, each unique hash string is related to an associated character. In one preferred embodiment, all associated characters in the LUT are initialized to the ASCII space character. Note that throughout this application the space character is either referred to as "space character" or represented as an underscore "_". It can be appreciated that the initialization of the LUT associated character entries is not critical. However, the initialization must be identical in the compression and decompression processes.

One well known hash function that is often used in dictionary-type data management applications is the "middle of square" function. This function is computed by squaring the operand and then using a predetermined number of bits from the middle of the resultant square to obtain the memory address. Another commonly used hash function incorporates the MODULO operator. The MODULO function divides the operand by some number M and the remainder R is used as the memory address. It is known in the art that if M is the divisor, the number of memory addresses accessible is M. Regardless of which particular hash function is used, an easily computable function is preferred. In the present context, an easily computable hash function is one that generates the memory address with minimal calculations, thus providing rapid access to the adaptive LUT.

Figure 2:
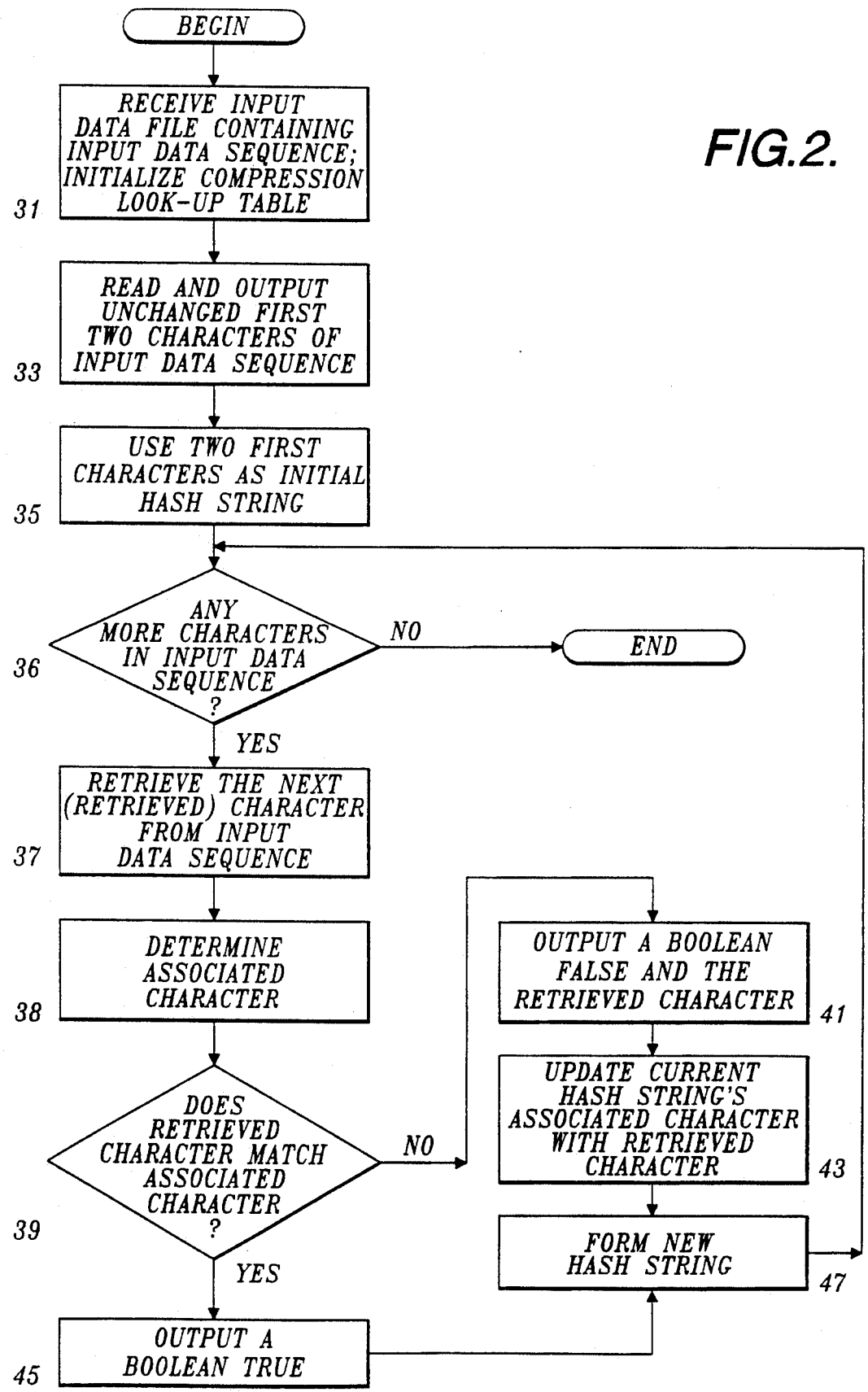
FIG. 2 is a flow diagram illustrating a method of compression of data in accordance with the present invention.

With reference to FIG. 2, the compression method begins by receiving an input data file that contains the input data sequence at box 31. The step of receiving refers to any number of data transfer or data generation means. An example of the compression of a simple ASCII text file is described. In the well-known ASCII alphabet, an 8-bit code is used to represent up to 256 characters. Since an 8-bit data string is also known as a byte, each letter or numeral can be represented by a byte of data. Although the present description refers to analyzing "characters", it can be appreciated that, in actuality, a code representation, such as the ASCII form, is actually analyzed. However, for clarity throughout this description, the inputs and outputs of the present invention will be spoken of in terms of alphanumeric characters.

Also at box 31, an LUT is established in memory and the output from a hash function is used to identify memory addresses. A conceptual LUT is shown in FIG. 3A. The LUT illustrates the mapping between the hash strings and their associated characters. It is to be understood that in an actual implementation, the hash string would not be stored in the table; rather, the result of hash function $f$(HASH STRING) would be used to address the appropriate associated character's table entry.

Moreover, FIG. 3A illustrates entries for all of the possible hash strings. In the preferred embodiment the hash string length is two characters, thus there are a total of 65,536 LUT entries, assuming 256 characters in the character set. If the entries are arranged in alphabetical fashion as shown in FIG. 3A, the first entry is AA, the next entry is AB, etc. through all possible permutations of two characters. All of the permutations in the LUT are typically not utilized because not all possible permutations will appear in a particular input data sequence. Although the memory used for forming the LUT may have 65,536 memory slots, typically only a percentage of the memory slots are ever accessed or used. Thus, although FIG. 3A shows entries for AA and AB, those particular combinations of characters may not appear in the input data sequence and therefore not be used. In FIGS. 3B-3F, which in conjunction with the description below illustrates the method of compression, only the relevant entries of the LUT are illustrated.

Next, at a box 33, the first two characters of the input data sequence are output by the data compressor unchanged. By way of specific example, assume that the input data sequence begins with the text THIS IS .... The data compressor outputs the T and H characters of the word THIS unchanged.

At a box 35, the iterative compression procedure begins. The first two characters of the input data sequence (TH) are used to form an initial hash string, also known as the current hash string. At a box 36, a check is made to determine whether or not there are any additional characters in the input data sequence. If there are no more characters, the compression of the input data sequence is complete and the procedure ends. However, if there are additional characters to be compressed, the procedure continues at a box 37 where the next sequential character in the input data sequence after the hash string is considered. This character is referred to as the retrieved character. In the example above, in the first iteration, the retrieved character is I.

Next, at a box 38, the associated character for the current hash string is identified in the LUT. The memory address for the associated character entry is determined by $f$(HASH STRING). The result of the function is a memory address. As is shown in FIG. 3A, the associated character for memory address $f$(TH) is a space character "_", since the LUT was initialized to all space characters. Next, at a box 39, a comparison is made between the retrieved character "I" and the current hash string's associated character "_". Because the characters do not match, at a box 41 a no match indicator, in the preferred embodiment a Boolean FALSE, is output followed by the retrieved character I. A retrieved character that is output following a Boolean FALSE is also called an exception character. As is well known in the art, Boolean values are represented by one bit, with FALSE generally being 0 and TRUE being 1; these representations will be used in this description. Because no match was found, the LUT is updated to reflect the actual data string. At a box 43, the retrieved character replaces the current hash string's associated character in the LUT. Thus, as shown in FIG. 3B, the character I is now the entry for the memory address associated with current hash string TH.

If, however, the retrieved character had matched the current hash string's associated character, at a box 45, a match indicator, in the preferred embodiment a Boolean TRUE (1), would be output and the LUT would be unchanged. Thus, if there were a match, the 8-bit character I would be compressed to a 1-bit Boolean TRUE (1). Generally, the output of the data compressor following the initial two unchanged characters will either be a pair comprising a 0 followed by an exception character or a single bit 1. This provides for a savings of 7 bits each time a match occurs. In comparison, when a match does not occur, no compression takes place and an additional bit appears in the output code.

Regardless of whether a match occurred or not, at a box 47 a new hash string is formed so as to progress through the input data sequence. In this preferred embodiment where the hash string is two characters in length, the new hash string is comprised of the second character of the current hash string concatenated with the retrieved character. Thus, in the example, the new hash string is HI. This formation of a new hash string is a specific case of a general rule. The general rule is that the first character, i.e., leftmost character, of the current hash string is dropped and the retrieved character is appended as the last character, i.e., rightmost character, of the new hash string. Thus, if the hash string length were three characters, a new hash string is formed by dropping the first character and appending the retrieved character to the remaining two characters. With reference to FIG. 4, the sequence of hash strings can be seen more clearly. Returning once again to the example of the input data sequence comprised of the text THIS IS, the first hash string 101 is TH and the first retrieved character is I. After the first compression pass, the second hash string 103 is HI and the second retrieved character is S. Similarly, after the second compression pass, the third hash string 105 is IS and the third retrieved character is "_". Thus, the hash strings are a series of fixed-length overlapping segments and the retrieved characters are the look-ahead characters following each hash string. After a new hash string is formed, the process then returns to box 36 and the process described in connection with boxes 36–47 continues until the entire input data sequence has been compressed.

To illustrate the compression processes, the step-by-step LUT configuration and output for the example string THIS IS are shown in FIGS. 3 and 5, respectively. As noted earlier, the method of the present invention begins by outputting directly the first two characters TH at 111 from the input data sequence. These first two characters also form the initial hash string. The next retrieved character is the character I. A comparison is made between the retrieved character I and the associated character "_" at $f$(TH). Since there is no match, a Boolean FALSE (0) is output followed by the I character at 113. Because no match occurred, the associated character at $f$(TH) is replaced by the retrieved character I in the LUT; the relevant portion of the LUT appears as in FIG. 3B. Next, the new hash string HI is formed.

The next retrieved character S is then compared to the associated character "_" at $f$(HI) and is found not to match. Once again, a Boolean FALSE (0) is output followed by the retrieved character S at 115. The associated character $f$(HI) is changed from "_" to S as seen in FIG. 3C. A new hash string IS is then formed.

The next retrieved character is the space character "_" following the word THIS in THIS IS. Thus, when a comparison is made between the retrieved character "_" and the associated character "_" at $f$(IS), there is a match. Thus, a Boolean TRUE (1) 117 is output. The new hash string S_ is formed and the LUT is unchanged and is seen in FIG. 3D.

Continuing with the example, the next retrieved character is I. The retrieved character I and the associated character "_" at $f$(S_) do not match. Thus, a Boolean FALSE (0) and the retrieved character I are output at 119. The updated LUT now appears as in FIG. 3E. The next retrieved character S is compared with the associated character "_" at $f$(_I); again, there is no match. Therefore, a Boolean FALSE (0) and the retrieved character S are output at 121. The associated character at $f$(_I) is changed to S as shown in FIG. 3F. In the example above, the input data sequence THIS IS is compressed into TH0I0S10I0S. The original input data sequence is comprised of seven characters (including the space character) with each character requiring 8 bits for a total of 56 bits. In contrast, the compressed representational form is comprised of six exception characters (each requiring 8 bits) and 5 Boolean bits, for a total of 53 bits. In this example, there is a transmission savings of 3 bits. It is expected that as the compression of the input data file continues, the degree of compression will increase. It can be seen that other LUT initialization schemes might be used to increase the initial compression rate. For example, a LUT established during the compression of a similar type of input data sequence could be established as the initial LUT at box 31.

In the example, the first two characters of the representational form are the initial hash string. The next sequential Boolean bit is retrieved. If the bit is FALSE, the next character is an exception character and the next 8-bit character is directly output. In addition, the exception character replaces the associated character at entry $f$(HASH STRING) in the decompression LUT. If the next Boolean bit is TRUE, the method outputs the associated character at f(HASH STRING) in the decompression LUT. Regardless of whether the Boolean bit is TRUE or FALSE, a new hash string is constructed by dropping the first character in the current hash string and appending the last character output by the decompressor to the remainder of the hash string. The process continues until the last bit in the representational form has been considered. The resultant output should be the same as the original input data sequence. Error checking methods used to identify compression errors are discussed below.

Figure 6:
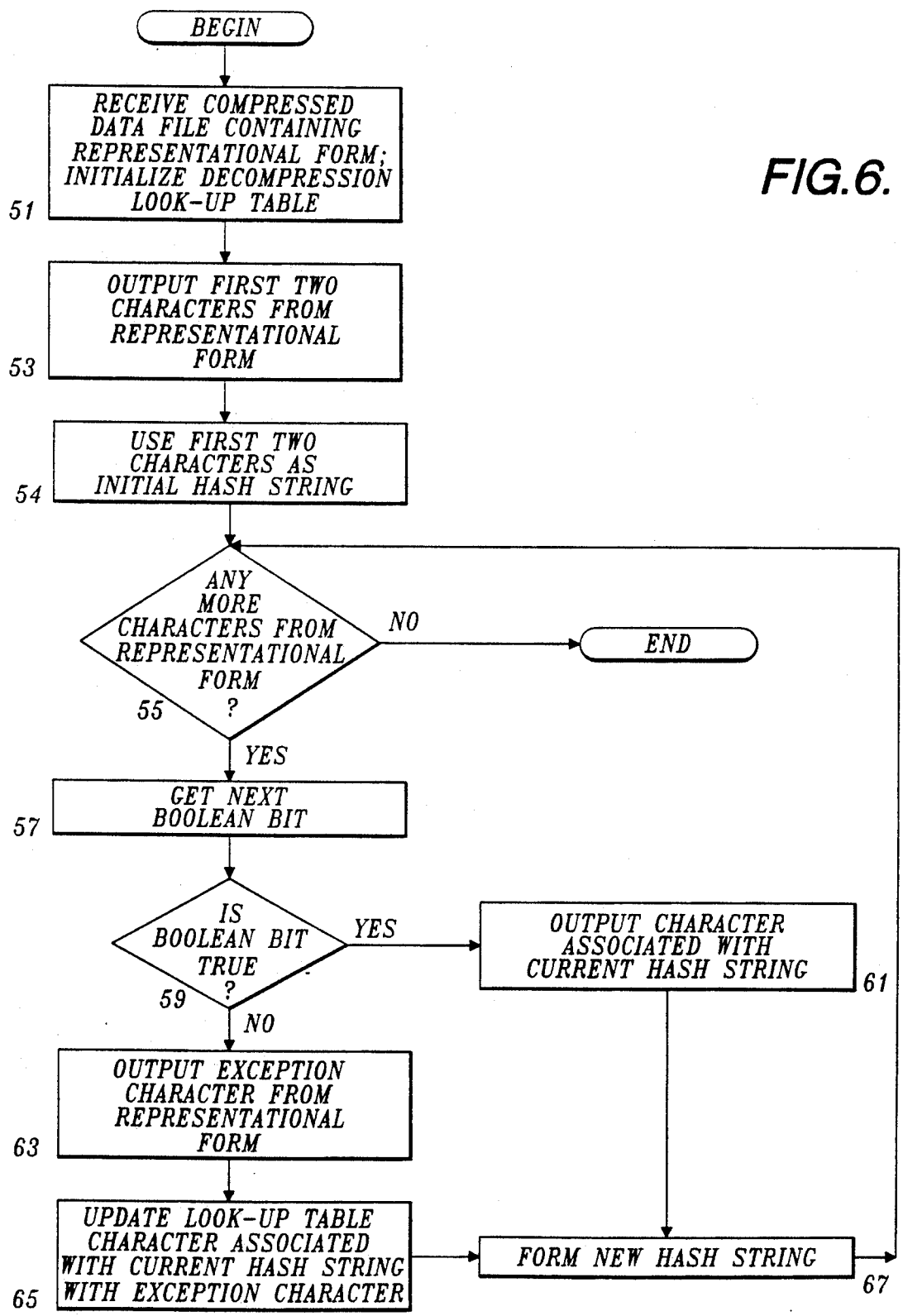
FIG. 6 is a flow diagram illustrating a method of decompression of data in accordance with the present invention.

With reference to FIG. 6, a method of decompression in accordance with the present invention is shown. At boxes 51-54, the compressed data file containing the representational form (shown in FIG. 5) of the original input data sequence is received and the initial decompression takes place. The compressed data file may be retrieved from memory or may be received as a real time transmission. At boxes 55-59, the next sequential Boolean bit is retrieved and interpreted, and at boxes 61-67, decompressed characters are output in accordance with the Boolean bit.

At a box 51, the data decompressor receives a compressed data file containing the representational form from the data compressor. The representational form for the example used above is TH0I0S10I0S. The decompression LUT is also initialized. Because of the relationship between the compression method and the decompression method, it is necessary that all memory entries be initialized identically to the initialization of the LUT in the compression method. Thus, in the preferred embodiment, all associated characters at the memory addresses forming the decompression LUT are initialized to the space character "_".

At a box 53, the data decompressor retrieves the first two characters and outputs them unchanged. Furthermore, at box 54, these first two characters form the initial or current hash string. It can be appreciated that, depending upon the particular compression system, the number of characters in the initial hash string can vary. The important consideration is that the hash string length at the decompressor is equivalent to the hash string length at the compressor.

At a box 55, a check is made to determine whether there are remaining characters in the representational form. If not, the decompression is completed and the process ends. If, however, there are more characters in the representational form, the next Boolean bit from the representational form is fetched at a box 57. Because of the procedure implemented by the compressor, it is known that a Boolean bit follows the initial two characters, since either a Boolean TRUE (1) or a Boolean FALSE (0) followed by an exception character are always output. This pattern is repetitive, i.e., after an exception character or a Boolean TRUE, another Boolean bit follows.

At a box 59, if the Boolean bit is TRUE, then at a box 61, the decompressor outputs the associated character f(HASH STRING) in the LUT. The same hash function f(x) that was used in the compression system is used in the decompression system. If, however, the Boolean bit is FALSE, at a box 63, the next sequential exception character from the representational form is output. This character was not compressed during the encoding procedure. Further, at a box 65, the associated character at f(HASH STRING) in the LUT is replaced with the current exception character. In this manner, the LUT adapts to the current output. The modification of the decompression LUT is identical to the modification to the compression LUT described above. Thus, FIGS. 3A-3G are equally applicable in the compression or decompression description.

Regardless of which conditional branch is taken, at a box 67, a new hash string is constructed by concatenating the most recent output character to the second character of the current hash string, whether or not the output character was an exception character or an associated character. After box 67, the process returns to box 55 and checks for the end of the representational form. The loop from boxes 55-67 is repeated until the representational form is completely analyzed.

As an example of the method of decompression, the decompression of a portion of the representational form described in conjunction with the compression example above is described with reference to FIGS. 3A-3F. First, the representational form is received and the first two characters TH of the representational form are output directly.

Next, since there is additional data, the next Boolean bit 0 is retrieved. The 0 indicates that the next character in the sequence was not compressed. Thus, the output of the decompressor is the next sequential character I, which is an exception character. Further, the associated character at f(TH) is replaced in the decompression LUT with the exception character I, as shown in FIG. 3B. A new hash string HI is formed and the process returns to check for any more data. This procedure continues with the retrieval of the next Boolean bit 0; the next S exception character is thus output. Further, the S replaces the associated character at f(HI) in the decompression LUT, as shown in FIG. 3C.

During the next iteration, Boolean bit 1 is retrieved. The 1 or TRUE indicates that compression of a character was successful. Thus, the output is the associated character at f(IS) in the decompression LUT. In this case, the output character is "_". The new hash string S_ is formed and the LUT is unchanged. The output thus far is THIS_. The decompression process continues until the representational form is completely analyzed.

One advantage of a data compression system formed in accordance with the present invention is that such a system is resistant to errors related to changes in the representational form between compression and decompression. The present invention is resistant to phase errors, which are one type of error in data transmissions. A phase error occurs when the receiver does not receive the correct number of bytes. The data compression method of the present invention outputs either, (1) a Boolean TRUE or (2) a Boolean FALSE and an exception character, for each character in the original data file with the exception of the characters in the initial hash string. The total number of Boolean bits output, the Boolean count, in compressing the original data file can be used to detect phase errors. The total number of characters which are compressed and transmitted is determined at the compressor by counting the iterations through boxes 36-47. The count of the total number of characters compressed, the character count, can be transmitted to a receiver along with the representational form of the data. A receiver can determine whether phase errors have occurred by comparing the character count to the Boolean count.

This ability to detect phase errors is due in part to the use of fixed length strings in the encoding process. At each iteration of the compression and decompression process, a single byte of data is analyzed. With other systems, such as the LZW, variable length strings may be encoded at each encoding iteration, and a process for counting the number of bytes in an input string is not readily integratable into the main loop of the system.

As seen in the example above, the LUT maintained by the method of the present invention is constantly modified as the input sequence changes. The LUT tends to grow in size as large input data files are compressed and additional unique character pairs are encountered. In a typical text file, the LUT could conceivably grow to a size of all possible character pair combinations (in the case of 2-character hash string length) of all possible characters. For example, in the ASCII alphabet the number of possible hash strings would be 65,536 (i.e., 256×256). However, in actual practice, all possible hash strings are rarely used. Nevertheless, the method provides the benefit that the amount of memory required by the process has a calculable upper limit and is not boundless, given a fixed alphabet and hash string length. Further, data compression in accordance with the present invention provides a maximum upper limit of file growth of 12.5%. Specifically, assuming that the input data sequence to be compressed is completely non-repetitive, therefore providing no matches between the retrieved characters and the associated characters, the maximum file growth is one additional Boolean bit per eight bit character. Moreover, although in one preferred embodiment the hash string length is two characters, it can be appreciated that the method of the present invention can use a hash string of any length including partial characters such as 1.5 characters or 12 bits of data. By changing the hash string length, various compression efficiencies can be achieved.

While a preferred embodiment of the invention has been illustrated and described, it will be appreciated that various changes can be made therein without departing from the spirit and scope of the invention. For example, the initialization of the LUT can be relatively arbitrary, the important consideration being that the compression LUT and the decompression LUT are identically initialized.

Further, in the preferred embodiment the sequence has the Boolean TRUE/FALSE output interspersed with the 8-bit characters. Alternatively, the Boolean TRUE/FALSE outputs can be separately combined into one output segment and the alphanumeric exception characters can form another segment. The decompression method of the present invention can just as easily decompress the two segments from the separated files referring first to the exception character file to retrieve the initial uncompressed hash string, then to the Boolean segment to begin decompression. The exception character segment is then referenced whenever a Boolean FALSE appears.

Moreover, although the present invention has been described in terms of a compressor producing a compressed representational form, which is later decompressed, it can be appreciated that the method of the present invention can be implemented in pseudo-real time. For example, the decompressor can continuously read the representational form from a compressor and reform the original data file contemporaneously. This situation is particularly useful in real-time data transmission over a telecommunications network. Thus, the invention can be practiced otherwise than as specifically described herein.

The present system also exhibits characteristics of a Cyclic Redundancy Check (CRC) because it can be self-verifying. For example, to perform such a check the last three characters from the input file could be output directly, i.e., unencoded, after all of the encoded information is output. To do so, the last three characters analyzed are always stored in a data buffer. When the compression is completed, the last three characters are added to the compressed file. A code is also included in the output, prior to the three characters, to indicate to the decompressor that these are the last three characters in unencoded form. The decompressor then decodes all of the representational form and compares the last three decoded characters to the unencoded last three characters. If there was a problem with the transmission or decompression, it is highly unlikely that the last three decoded characters would be correct. Thus, if the decoded and uncoded characters do not match, the operator receives a communication error message. Alternatively, the system verifies the success of the overall process if the last three characters were decoded properly.

The present system can also be used as a data encryption method. Such methods are used when it is desirable to represent data in a format that is not readily understandable. The system can also be used in optical character recognition systems and image processing systems. Because the present invention assumes that there will be a certain redundancy in the input data, the look-up tables can be used as "look-ahead" tables that include clues to information that cannot quite be recognized in the normal course of character recognition. For example, a look-up table can be built as an image is being processed and then, if a character is unclear, the look-up table can be referred to using a hash string of characters immediately preceding the unrecognized character, and provide the associated character.

Finally, many types of data files are compressible using the present invention, as long as the files contain a sequence of discrete characters. For example, among the types of compressible data files are: plain ASCII text files, DOS executable program files, C source files, Microsoft Word 5.0 documents, Presentation Manager font files, OS/2 Dynamic Link Library files, and CompuServe Graphics Image files. In fact, almost every computer file can be thought of as a sequence of discrete characters, and thus compressible by the present invention.

While the preferred embodiment of the invention has been illustrated and described, it will be appreciated that various changes can be made therein without departing from the spirit and scope of the invention. Accordingly, it is not intended that the scope of the present invention be in any way limited by the disclosure of the preferred embodiment, but instead that it be determined entirely by reference to the claims that follow.

The embodiments of the invention in which an exclusive property or privilege is claimed are defined as follows:

1. An adaptive data compression method for compressing an input data sequence comprised of a plurality of sequential discrete characters, said method comprising the steps of:
   (a) forming a current hash string by sequentially retrieving from said input data sequence a predetermined number of characters, said current hash string having an associated character;

(b) retrieving a retrieved character, said retrieved character sequentially following said current hash string in said input data sequence;

(c) comparing said retrieved character to said current hash string's associated character:
 (i) if said retrieved character matches said current hash string's associated character, outputting a match indicator; and
 (ii) if said retrieved character does not match said current hash string's associated character, outputting both a no-match indicator and said retrieved character as an exception character and associating said retrieved character with said current hash string;

(d) forming a new hash string having said predetermined number of characters and including said retrieved character, said new hash string having an associated character;

(e) assigning said new hash string as said current hash string; and (f) repeating steps (b) through (e).

2. The method of claim 1, wherein said step of repeating steps (b) through (e) is repeated until no more characters are present in said input data sequence.

3. The method of claim 1, wherein said step of forming a new hash string includes the step of concatenating said retrieved character to said current hash string and deleting the first character of said current hash string's.

4. The method of claim 1, further including the step of forming a hash table in a memory device, said hash table for storing said associated characters, said hash table comprising a plurality of memory slots for storing said associated characters, each of said memory slots having a memory address.

5. The method of claim 4, wherein said step of comparing said retrieved character includes the steps of:
generating a memory slot address by performing a hash function on said current hash string;
looking-up said current hash string's associated character at said memory slot address; and
if said retrieved character does not match said current hash string's associated character, associating said retrieved character with said current hash string by storing said retrieved character at said memory slot address.

6. The method of claim 4, wherein an initial associated character is stored in each of said memory slots prior to said step of comparing said retrieved character.

7. The method of claim 4, wherein the output of step (c) is written to a compressed data file in said memory device.

8. The method of claim 1, wherein said match indicator is a Boolean TRUE bit and said no-match indicator is a Boolean FALSE bit.

9. The method of claim 1, wherein said hash strings are two characters in length.

10. The method of claim 1, wherein said hash strings are three characters in length.

11. The method of claim 7, further comprising the steps of decompressing said compressed input data by:
(a) outputting a current decompression output hash string equivalent to said current hash string of step (a) of claim 1, said current decompression output hash string having an associated character;

(b) retrieving a next sequential character from said compressed data file; and (i) if a match indicator is retrieved, outputting said current decompression output hash string's associated character; and
 (ii) if a no-match indicator is retrieved, retrieving and outputting said next sequential exception character from said compressed data file and associating said exception character to said current decompression output hash string;

(c) forming a new decompression output hash string including said character output at step (b);

(d) assigning said new decompression output hash string as said current decompression output hash string; and (e) repeating steps (b) through (d).

12. The method of claim 11, wherein said step (e) is repeated until no more characters are remaining in said compressed data file.

13. The method of claim 11, wherein said step of forming a new decompression output hash string includes the step of concatenating said retrieved character to said current decompression output hash string and deleting said current decompression output hash string's first character.

14. The method of claim 11, further including the step of forming a decompression hash table for storing said associated characters, said decompression hash table comprising a plurality of decompression memory slots for storing said associated characters.

15. The method of claim 2 further comprising the steps of decompressing said input data by:
(a) forming a current output hash string identical to the current hash string of step (a) of claim 1;
(b) outputting said current output hash string, said current output hash string having an associated character;
(c) receiving the next match indicator or no match indicator; and
 (i) if a match indicator is received, outputting said current output hash string's associated character; and
 (ii) if a no-match indicator is received, receiving and outputting a next sequential exception character and associating said exception character to said current output hash string;
(d) forming a new output hash string by deleting said current output hash string's first character and concatenating the last character output;
(e) assigning said new output hash string as said current output hash string; and
(f) repeating steps (c) through (e) until no more match indicators or no-match indicators are received.

16. The method of claim 15, further including the step of forming a decompression hash table in a memory device, said decompression hash table for storing said associated characters, said decompression hash table comprising a plurality of memory slots for storing said associated characters, each of said memory slots having a memory address.

17. A data compressor for compressing an input data sequence comprised of a plurality of sequential discrete characters, the data compressor comprising:
(a) an input component for receiving an input data sequence;
(b) processor means for:
 (i) forming a current hash string by sequentially retrieving from said input data sequence a predetermined number of characters, said current hash string having an associated character;

(ii) retrieving and comparing a retrieved character, said retrieved character next sequentially following said current hash string in said input data sequence, to said current hash string's associated character; and (iii) outputting a match indicator if said retrieved character matches said associated character; and outputting both a no-match indicator and said retrieved character as an exception character if said retrieved character does not match said associated character and associating said retrieved character with said current hash string.

18. A data compressor as claimed in claim 17, wherein said processor means further includes means for forming a new hash string having said predetermined number of characters and by concatenating said retrieved character to said current hash string and deleting a first character from said current hash string, and for assigning said new hash string as said current hash string, and for analyzing said entire input data sequence.

19. The compressor of claim 17, further including a memory device in which a hash table is established, said hash table comprising a plurality of memory slots for storing associated characters, each of said memory slots having a memory address.

20. The compressor of claim 17, wherein said means for comparing a retrieved character to said current hash string's associated character performs a hash function on said hash string to derive a memory slot address and compares said associated character at said memory slot address to said retrieved character and further associates said retrieved character with said current hash string by storing said retrieved character in said memory slot address.

* * * * *